United States Patent [19]

Gard

[11] Patent Number: 4,992,748
[45] Date of Patent: Feb. 12, 1991

[54] PERIOD-INVERTING FM DEMODULATOR

[75] Inventor: Michael F. Gard, New Berlin, Wis.

[73] Assignee: Atlantic Richfield Company, Los Angeles, Calif.

[21] Appl. No.: 406,582

[22] Filed: Sep. 13, 1989

[51] Int. Cl.$^5$ .......................... H03D 3/00; H03K 9/06
[52] U.S. Cl. .................................... 329/321; 329/327; 329/343; 375/82
[58] Field of Search ................ 329/315, 300, 301, 302, 329/303, 323, 327, 341, 342, 343, 321; 455/214; 375/80, 82, 88, 94, 95

[56] References Cited

U.S. PATENT DOCUMENTS

| | | |
|---|---|---|
| 3,349,328 | 10/1967 | Hunkins et al. |
| 3,377,560 | 4/1968 | Renshaw |
| 3,454,718 | 7/1969 | Perreault |
| 3,546,486 | 12/1970 | Jacobson ........................ 329/321 X |
| 3,623,075 | 11/1971 | Bench et al. ..................... 329/104 X |
| 3,632,876 | 1/1972 | Bench ........................... 340/347 DD |
| 3,665,103 | 5/1972 | Watkins |
| 3,670,250 | 6/1972 | Fritkin ............................... 329/343 |
| 4,021,744 | 5/1977 | Montefusco ....................... 329/300 |
| 4,441,193 | 4/1984 | Bell .................................... 375/25 |
| 4,558,284 | 12/1985 | Zaidenweber ..................... 329/343 |
| 4,596,022 | 6/1986 | Stoner ................................. 375/45 |

FOREIGN PATENT DOCUMENTS 61-192105 8/1986 Japan ................................ 329/343

Primary Examiner—Siegfried H. Grimm
Attorney, Agent, or Firm—Vinson & Elkins

[57] ABSTRACT

An FM discriminator (34) which independently recovers modulating information from each half-cycle of a modulated waveform (16) is disclosed. The discriminator (34) includes a comparison circuit (36-42, 80-82) which produces bipolar signals describing positive and negative half-cycles of the modulated waveform (16). These bipolar signals are de-glitched (80, 82, 52, 54) for respective positive and negative counter circuits (44p, 44n). Each of the counter circuits (44) includes a counter (58) which counts a high speed clock signal supplied by a clock generator (46) during one of the half-cycles to produce a period count that describes the duration of the half-cycle. During a subsequent half-cycle, a translation circuit (60) converts the period count into an amplitude value that describes the information modulated onto the modulated waveform (16), and a resetting circuit (64-68) presets the counter (58) to an initial value. The counter circuits each additionally include an optional D/A converter (70) to provide an analog signal. Analog signals from the positive and negative counter circuits (44p, 44n) are combined in a multiplexer (48) to supply a single analog reconstruction of the modulating information.

24 Claims, 1 Drawing Sheet

PERIOD-INVERTING FM DEMODULATOR

CROSS REFERENCE TO RELATED APPLICATIONS

Cross reference is made to: "System For High Speed Data Transmission", application Ser. No. 406,464, filed on the same date, by the same inventor, and assigned to the same assignee as the present application.

TECHNICAL FIELD OF THE INVENTION

The present invention relates generally to the reception of signals encoded to convey information. More specifically, the present invention relates to the demodulation of frequency modulated signals so that a wide instantaneous frequency deviation is permitted relative to a carrier center frequency.

BACKGROUND OF THE INVENTION

In the oil field industry, as well as others, electrical information is often transmitted through a transmission channel which consists of a long cable. In oil field applications, the long cable may extend from the bottom of a well to the earth's surface, and the electrical information may represent logging data collected at the well bottom. Increased sophistication of well logging tools makes the gathering of increasingly detailed down-hole information more practical. However, a typical logging cable presents a severe bottleneck to the communication of such information to the earth's surface. A typical logging cable exhibits a usable signal bandwidth extending from DC to approximately only 30 KHz at best. Thus, when higher frequency analog waveforms are transmitted to the earth's surface over a logging cable, amplitude and phase distortions caused by the logging cable unacceptably corrupt the transmitted signal, especially the signal's high frequency details.

While amplitude and phase distortions may be compensated to a degree, the compensation techniques are generally tailored to specific cable characteristics. Consequently, compensation techniques which permit the transmission of high frequency signals through a particular cable, of a particular length, used in a particular environment, fail to adequately compensate for distortions caused by other cables, lengths, or environments.

Frequency domain techniques may be used to gain independence from cable specifics. Thus, by translating the transmitted information into frequency fluctuations, amplitude and phase distortions do not harm the frequency encoded information, and are therefore easily compensated. Moreover, such compensation utilizes conventional techniques which need not account for individual cable parameters.

On the other hand, frequency domain techniques, such as conventional frequency modulation (FM), require a suitable demodulator at the receiving end of the cable to translate communicated information back into its original form. Moreover, conventional FM demodulators, which include phase locked loop circuits and integrators driven by zero-crossing detectors, fail to provide an adequate solution to FM demodulation in this environment.

Conventional FM demodulators from commercial applications, such as aircraft telemetry, typically allow an information signal's bandwidth to exhibit a maximum frequency deviation from a carrier frequency, typically $\pm 15\%$ to $\pm 30\%$ of the carrier's center frequency. For many applications, such as when public airwaves are used to broadcast information, regulatory requirements limit frequency channels to prevent inter-channel interference, resulting in what is known as narrowband FM. However, when a private cable serves as a transmission channel, large frequency channel bandwidths relative to the carrier center frequency could be used if a satisfactory demodulator were available. Thus, conventional demodulator techniques limit available channel bandwidth for reasons which are not pertinent to well logging and other applications utilizing long electrical cables.

An integrator driven by a zero-crossing detector and a pulse generator represents a popular, conventional demodulation technique which suffers from yet another problem. Specifically, the current transients produced by zero-crossing detectors and pulse generators tend to inject an excessive amount of noise into surrounding noise-sensitive circuits. As a result, highly accurate signal reproductions cannot be achieved.

Still further, conventional FM demodulators, which tend to be predominantly analog in design, are often excessively difficult to utilize due to a requirement for numerous adjustments and calibrations. Consequently, such demodulators produce potentially inaccurate results when such adjustments and calibrations are either omitted or performed incorrectly. Oftentimes, critical circuits are temperature sensitive. Moreover, such conventional FM demodulators utilize essentially analog processes to recover the modulating signal from a carrier. When these conventional FM demodulators are embedded in a digital system, the recovered modulating signal must be digitized for processing by a computer or other digital circuits. Thus, digitizing errors compound reconstruction errors to cause such conventional FM demodulators to generate unacceptably large overall errors.

SUMMARY OF THE INVENTION

Accordingly, it is an advantage of the present invention that an FM demodulator is provided in which the rate at which data is demodulated from a modulated waveform is substantially independent of the center frequency.

Another advantage of the present invention is that an FM demodulator suitable for demodulating analog or digital data is provided.

Yet another advantage is that the present invention provides an FM demodulator in which few or no calibrations are required.

Still another advantage is that the present invention provides an FM demodulator in which analog or digital data may be recovered from a modulated waveform at a relatively high rate or frequency compared to the center frequency.

Yet another advantage is that the present invention provides a substantially digital demodulation which demonstrates improved noise immunity and which directly outputs a digitized representation of modulating information.

The above and other advantages of the present invention are carried out in one form by a discriminator which includes an identifying circuit that processes a modulated waveform to identify first and second points in time on the modulated waveform. A measuring circuit couples to the identifying circuit so that a quantity of events are measured during the time that transpires between the first and second points in time. Thus, the measuring circuit produces an output which represents the duration between the first and second points in time. A translating circuit couples to the measuring circuit to convert the duration into an amplitude value descriptive of modulating information from the carrier waveform.

BRIEF DESCRIPTION OF THE DRAWINGS

A more complete understanding of the present invention may be derived by referring to the detailed description and claims when considered in connection with the FIGURES, wherein like reference numbers refer to similar items throughout the FIGURES, and:

DETAILED DESCRIPTION OF THE PREFERRED EMBODIMENT

Figure 1:
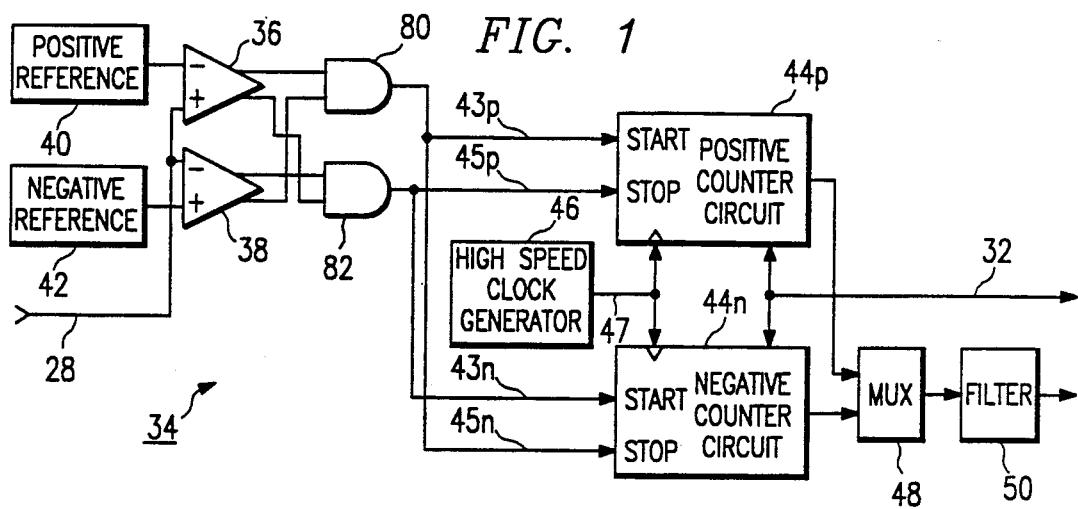
FIG. 1 is a block diagram of a period-inverting discriminator circuit constructed in accordance with the teaching of the present invention.
Figure 3:
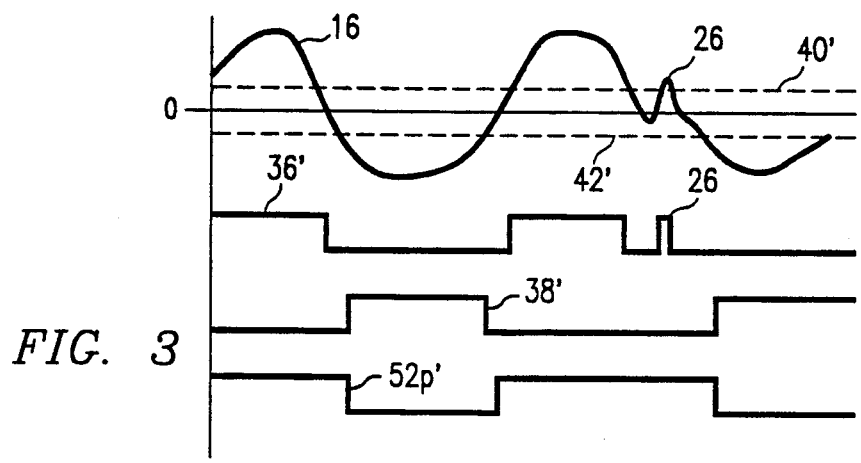
FIG. 3 is a timing diagram of various signals which illustrate the operation of the present invention.

The present invention processes a modulated waveform 16, shown in FIG. 3, to recover information which has been modulated onto a suitable carrier. Thus, the present invention operates as an FM discriminator 34, which is depicted in FIG. 1. Discriminator 34 contemplates the modulation of either analog or digital information onto modulated waveform 16. When analog information modulates modulated waveform 16, modulated waveform 16 exhibits a continuum of frequencies present in a channel bandwidth which is centered upon a carrier center frequency. When digital information modulates modulated waveform 16, modulated waveform 16 generally exhibits only a discrete number of frequencies within the channel bandwidth, as is conventional in frequency shift keying (FSK) and related transmission schemes.

Discriminator 34 receives modulated waveform 16 at a signal input terminal 28. Terminal 28 couples to a non-inverting input of a positive comparator 36 and to an inverting input of a negative comparator 38. A positive reference voltage source 40 couples to an inverting input of comparator 36, and a negative reference voltage source 42 couples to a non-inverting input of comparator 38. Reference sources 40 and 42 supply DC voltage levels, which remain constant from cycle-to-cycle of modulated waveform 16, as shown in traces 40' and 42', respectively, of FIG. 3.

Comparators 36 and 38 are differential-output devices. Thus, each of comparators 36 and 38 have inverting and non-inverting outputs. FIG. 3 illustrates the operation of comparators 36 and 38. For clarity, only the signals generated by the non-inverting outputs of comparators 36 and 38 are illustrated in FIG. 3, as traces 36' and 38', respectively. Generally speaking, comparator 36 operates to identify beginning and end points in time of a positive half-cycle of modulated waveform 16, and comparator 38 operates to identify beginning and end points in time of a negative half-cycle of modulated waveform 16.

As shown in trace 36', the non-inverting output of positive comparator 36 exhibits a logical high value only when modulated waveform 16 exhibits an amplitude which exceeds the voltage amplitude provided by source 40, illustrated by trace 40' in FIG. 3. Simultaneously, the inverting output of comparator 36 exhibits a logical low value. Likewise, as shown in trace 38', the non-inverting output of negative comparator 38 exhibits a logical high value only when modulated waveform 16 exhibits an amplitude which is less than the voltage amplitude provided by source 42, illustrated by trace 42'. And, simultaneously the inverting output of comparator 38 exhibits a logical low value. Those skilled in the art will recognize that the non-inverting and inverting outputs of comparator 36 switch essentially simultaneous and are always complementary. This characterization also holds true for comparator 38. However, comparators 36 and 38 operate with respect to different reference voltages. Thus, the outputs of comparator 36 do not change states simultaneously with a change in states for the outputs of comparator 38, but independently assume states corresponding to the relationship of modulated waveform 16 with respect to the appropriate reference voltage level.

Thus, comparators 36 and 38 operate as hard limiters to remove amplitude information and fluctuations from modulated waveform 16 by converting modulated waveform 16 into bipolar signals. Since modulating information is encoded into the timing of the transitions between logical states of the output signals from comparators 36 and 38, this limiting operation has no substantial effect on the information content carried by modulated carrier waveform 16. However, some spurious transitions, or glitches, may result from noise, as shown at spike 26 of trace 36'.

Referring to FIG. 1, the non-inverting output of comparator 36 couples to a first input of an AND gate 80, and the inverting output of comparator 38 couples to a second input of AND gate 80. Likewise, the non-inverting output of comparator 38 couples to a first input of an AND gate 82, and the inverted output of comparator 36 couples to a second input of AND gate 82. An output of AND gate 80 couples to a start input 43p of a positive counter circuit 44p and to a stop input 45n of a negative counter circuit 44n. Conversely, an output of AND gate 82 couples to a stop input 45p of counter circuit 44p and to a start input 43n of counter circuit 44n.

The use of differential outputs from comparators 36 and 38, when taken with the use of AND gates 80 and 82, accomplish a de-glitching function. Due to the cross-coupling between comparators 36 and 38 and AND gates 80 and 82, the output of AND gate 80 does not go high (which starts counter circuit 44p) until the non-inverting output of comparator 36 and the inverting output of comparator 38 have both gone high. In other words, modulated waveform 16 must be more positive than both the positive reference 40 and the negative reference 42. If both of these conditions are not met, the modulated waveform 16 is either in transition between the two reference levels or was caused by a noise spike, as shown at spike 26 in FIG. 3. Only when both conditions are satisfied simultaneously can the modulated waveform 16 be considered to have made a positive transition.

Those skilled in the art will recognize that the amount of noise immunity in this invention is related to the voltage separation between positive reference 40 and negative reference 42. Furthermore, it is recognized that single output comparators followed by inverters could be used in place of differential comparators 36 and 38. However, for high speed applications, the differential devices are preferred.

A high speed clock generator 46 has an output 47 which couples to clock inputs of counter circuits 44p and 44n, and data busses of counter circuits 44p and 44n couple together and together serve as a digital output 32 from discriminator 34.

Each of counter circuits 44p and 44n additionally supplier an optional analog output. These analog outputs are recombined into a single analog signal in an analog multiplexer 48. The recombined analog signal couples through a low pass filter 50 to remove switching transients so that an analog signal output from filter 50 accurately tracks modulating information encoded into modulated waveform 16. Of course, those skilled in the art will recognize that counter circuits 44p and 44n need not supply analog outputs when digital data is being demodulated or when demodulator 34 is being embedded in a digital system. Moreover, in such applications multiplexer 48 and filter 50 are unnecessary because the digital data supplied at digital output 32 provides the modulating information reconstructed by discriminator 34.

Figure 2:
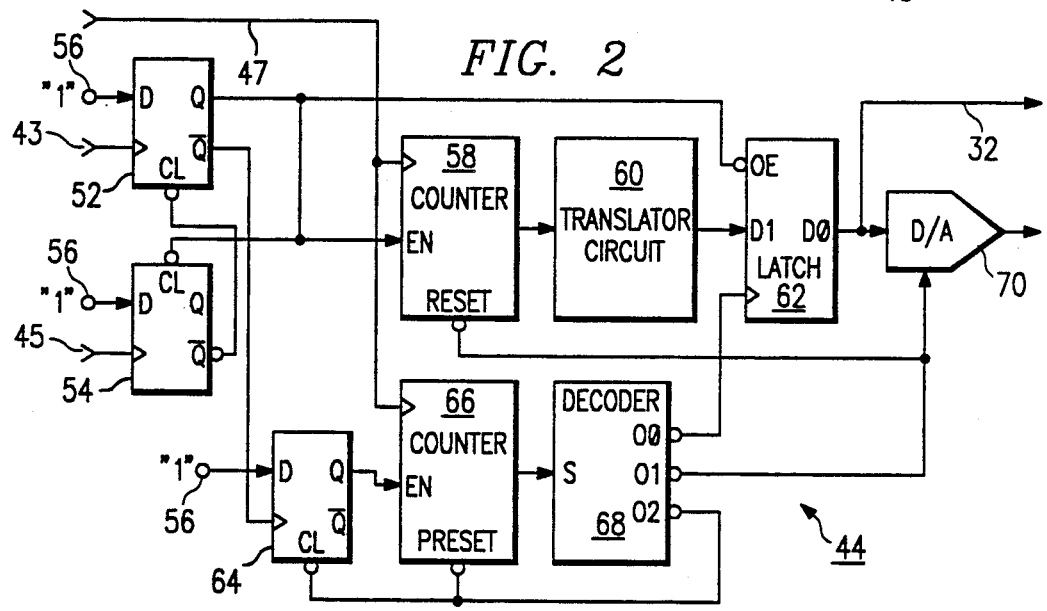
FIG. 2 is a block diagram of a counter circuit portion of the present invention.

FIG. 2 shows a block diagram which more specifically illustrates the structure of counter circuits 44p and 44n (see FIG. 1). In the preferred embodiment, counter circuits 44p and 44n are substantially identical to one another. Thus, FIG. 2 merely shows a single counter circuit 44 which may serve as either one of counter circuits 44p and 44n.

Generally speaking, each of counter circuits 44 incorporates a de-glitching circuit to remove noise spikes, and each incorporates a timing circuit to measure the duration between the beginning and end points of the half-cycle identified by AND gates 80 and 82. The timing circuit measures events which occur at a substantially faster rate than the anticipated instantaneous frequencies exhibited by modulated waveform 16 (see FIG. 3). These events are provided by transitions between logical states of a clock signal generated by clock generator 46. Moreover, counter circuits 44p and 44n alternate between a counting mode and a resetting mode, with each of circuits 44 continuously operating in an opposite mode from the other one of circuits 44.

Specifically, start input 43, discussed above, of counter circuit 44 couples to a clock input of a flip-flop 52, and stop input 45, discussed above, couples to a clock input of a flip-flop 54. "D" inputs of flip-flops 52 and 54 each couple to a terminal 56, which is adapted to supply a logical high value. A non-inverting output of flip-flop 52 couples to a clear input of flip-flop 54, and an inverting output of flip-flop 54 couples to a clear input of flip-flop 52.

Flip-flops 52 and 54 serve as a de-glitching circuit, and the non-inverting output of flip-flop 52 controls counting operations for the remainder of counting circuit 44 by defining counting and resetting modes of operation. Trace 52p' of FIG. 3 represents the signal supplied at the non-inverting output of flip-flop 52 in counter circuit 44p and depicts the operation of this de-glitching circuit. Accordingly, the non-inverting output of flip-flop 52 is clocked to a logical high value when the amplitude of modulated waveform 16 initially exceeds the threshold provided by references 40 and 42 (see FIG. 1). However, the state of flip-flop 52 does not change when modulated waveform 16 initially exhibits an amplitude less than the threshold provided by reference 40 yet greater than the threshold provided by reference 42. Thus, minor noise spikes, such as spike 26, have no effect on the state of flip-flop 52. Only when the amplitude of modulated waveform 16 eventually becomes less than the threshold provided by reference 42 does the state of flip-flop 52 change. Such change occurs in response to the clocking of flip-flop 54, which clears flip-flop 52 and is then cleared itself. As shown in trace 52p', noise spike 26 has been removed.

Counter circuit 44 measures the duration for which the non-inverting output of flip-flop 52 exhibits a logical high value, which represents the above-discussed counting mode of operation. Thus, the non-inverting output of flip-flop 52 couples to an enable input of a counter 58, and the clock input 47 from high speed clock generator 46 (see FIG. 1) couples to a clock input of counter 58.

In the preferred embodiment of the present invention, the clock signal supplied at clock input 47 exhibits a constant frequency which is as high as is reasonably possible. When the non-inverting output of flip-flop 52 is at a logical high value, counter 58 is enabled and counts the clock signal. When the non-inverting output of flip-flop 52 is at a logical low value, counter 58 is disabled and refrains from counting the clock signal. As discussed below, counter 58 begins counting from a preset count when it becomes enabled. Thus, the final count, or period count, achieved when counter 58 becomes disabled corresponds to the period of time which transpired while counter 58 was enabled. Moreover, the use of as high a frequency as is reasonably possible for the clock signal increases the precision with which this duration can be measured.

An output of counter 58, which may include as many as 12 or more bit lines due to the high frequency of the clock signal, presents a duration value to an input of a translation circuit 60. An output of translation circuit 60 couples to a data input of a latch 62, and an output of latch 62 couples to data bus 32, discussed above. Moreover, the non-inverting output of flip-flop 52 couples to an output enable input of latch 62, and the inverting output of flip-flop 52 couples to a clock input of a flip-flop 64. A "D" input of flip-flop 64 couples to terminal 56, which supplies a logical high value. A non-inverting output of flip-flop 64 couples to an enable input of a counter 66, and a clock input of counter 66 couples to clock input 47 to receive the clock signal supplied by clock generator 46. A data output of counter 66 couples to selection inputs of a decoder 68, and an "o" output of decoder 68 couples to a clock input of latch 62. An "01" output of decoder 68 couples to a preset or reset input of counter 58, and an "02" output of decoder 68 couples to a preset or reset input of counter 66 and to a clear input of flip-flop 64.

When counter circuit 44 supplies the above-discussed optional analog output, the data output of latch 62 couples to a digital input of a digital-to-analog (D/A) converter 70, and the "01" output of decoder 68 additionally couples to a latching input of D/A 70. The output of D/A 70 provides the analog output from counter circuit 44.

When the non-inverting output of flip-flop 52 switches to a logical low value, the inverting output of flip-flop 52 switches to a logical high value and the reset mode is initiated. This causes the non-inverting output of flip-flop 64 to become activated, thereby enabling counter 66. At the same time, the period count output by counter 58 becomes stable because counter 58 now refrains from counting the clock signal. Translation circuit 60 then translates this duration value into an amplitude value which describes modulation information encoded into modulated waveform 16 (see FIG. 3), and the amplitude value becomes stable after an appropriate delay.

Translation circuit 60 may be embodied in any one of several forms. For a general purpose, analog modulated carrier waveform or an M-ary digital modulation application, where M is an arbitrary number, translation circuit 60 is a PROM or other memory device. Thus, the input to translation circuit 60 represents an address input to the memory device, the output represents data outputs of the memory device, and the translation from time duration to amplitude occurs through a table lookup operation where the duration value serves as an index to the table. Since the duration value describes a period of a half-cycle of modulated waveform 16, this duration value is inversely proportional to the frequency of frequency modulated waveform 16. Hence, discriminator 34 (see FIG. 1) is referred to as a "period-inverting discriminator."

The data stored in the look-up table may be predetermined. Assume, for example, that counter 58 outputs a 12 bit number which may describe any one of 4096 possible discrete duration values detected by counter 58. Each of the 4096 possible duration values corresponds to a unique instantaneous frequency of modulated waveform 16 (see FIG. 3). The memory device of translation circuit 60 also has 4096 memory locations. Each of the 4096 memory locations contains an amplitude value descriptive of a modulating amplitude which causes modulated waveform 16 to exhibit the associated instantaneous frequency. Thus, a memory device translates the duration value into a digital amplitude value.

Of course, the output from counter 58 need not provide 12 bits, and translation circuit 60 need not be a memory device. For example, when modulated waveform 16 carries binary digital data, the translation decisions become simplified compared to analog or M-ary digital data. For binary data, translation circuit 60 needs only to resolve whether the period indicated by the duration value comes closer to describing the period of a relatively low frequency or the period of a relatively high frequency. Consequently, for binary data, translation circuit 60 may advantageously be a comparator in which a first comparison input serves as the input to translation circuit 60 and the output of translation circuit 60 is a single bit comparison output line. In this application, a second comparison input for the comparator couples to a predetermined data value. Period counts greater than the predetermined data value suggest the lower of the relatively high and low frequencies while period counts less than the predetermined data value suggest the higher.

Counter 66 cooperates with decoder 68 to delay the latching of the digital amplitude value output from translation circuit 60 into latch 62 until the amplitude value becomes stable. Thus particular count decoded by decoder 68 to cause the "O0" output to activate is not critical in the present i After the latching of latch 62, the "O1" output of decoder 68 activates, thereby either resetting counter 58 or presetting counter 58 to a predetermined value. In addition, when counter circuit 44 provides the optional analog output, activation of the "O1" output from decoder 68 causes the digital amplitude value to be latched into D/A 70 and converted into an analog representation of the digital amplitude value.

After the resetting or presetting of counter 58, output "O2" of decoder 68 activates to preset or reset counter 66 to a predetermined value and to clear flip-flop 64. At this point, the output of latch 62 has been enabled so that the digital amplitude value is output to data bus 32, and counters 58 and 66 are reset for a subsequent counting cycle.

In summary, the present invention provides an FM discriminator 34 in which either analog or digital modulation information may be reconstructed from modulated waveform 16 (see FIG. 3). Moreover, discriminator 34 independently demodulates modulating information from each half-cycle of modulated waveform 16. Consequently, the rate at which modulating information may be communicated using modulated waveform 16 is substantially independent of the center frequency of modulated waveform 16, and a wide bandwidth signal may be demodulated. Since discriminator 34 mostly utilizes a digital demodulation technique, few or no adjustments are required for proper operation of discriminator 34. Moreover, discriminator 34 demonstrates an improved immunity to noise when compared to conventional analog discriminators, and discriminator 34 directly provides a digital output signal. The direct generation of a digital output signal improves overall system error when compared to systems which encounter both signal recovery errors in generating a reconstructed analog output signal and sampling errors in digitizing the recovery signal.

The present invention has been described above with reference to a preferred embodiment. However, those skilled in the art will recognize that changes and modifications may be made in this preferred embodiment without departing from the scope of the present invention. Accordingly, those skilled in the art will recognize that each of the circuit blocks presented herein may be implemented using a variety of techniques. For example, counters 58 and 66 of FIG. 2 may count-up or count-down and may utilize counter chips having enable inputs or utilize external gates to achieve the enabling functions described herein. Moreover, those skilled in the art will recognize that the polarities, magnitudes, and frequencies discussed above are arbitrary parameters generally under the control of the designer. These and other changes and modifications which are obvious to those skilled in the art are intended to be included within the scope of the present invention.

What is claimed is:

1. A discriminator for demodulating a frequency modulated signal, comprising:
   means for identifying a first point in time at which the amplitude of the signal exceeds a first threshold value, and a second point in time at which the amplitude of the signal is less than a second threshold value, wherein said first threshold value is greater in amplitude than said second threshold value;
   means, coupled to said identifying means, for measuring the duration between said first point in time and said second point in time; and
   means, coupled to said measuring means, for translating said measured duration into an amplitude value descriptive of modulating information.

2. A discriminator as claimed in claim 1 wherein said identifying means comprises a limiter adapted to convert said frequency modulated signal into a substantially bipolar signal having rising and falling edges wherein the timing of said edges conveys said modulating information.

3. A discriminator as claimed in claim 2 wherein said measuring means comprises:

a clock generator for supplying a clock signal exhibiting a frequency greater than said carrier frequency; and a counter having a clock input coupled to said clock generator, having an enabling input coupled to said limiter, and having an output for supplying a duration value.

4. A discriminator as claimed in claim 3 wherein :
said counter additionally has a preset input; and
said discriminator additionally comprises means, coupled to said limiter and to said counter preset input, for presetting said counter to a predetermined count.

5. A discriminator as claimed in claim 1, wherein said means for identifying comprises:
a first comparator, having an input for receiving said modulated signal, an input for receiving a reference voltage at said first threshold value, and an output for indicating said first point in time, said output coupled to said means for measuring; and
a second comparator, having an input for receiving said modulated signal, an input for receiving a reference voltage at said second threshold value, and an output for indicating said second point in time, said output coupled to said means for measuring.

6. A discriminator as claimed in claim 5, wherein said means for measuring comprises:
a clock signal generator for generating a clock signal at a frequency greater than the frequency of said modulated signal;
a first counter, having a clock input coupled to said clock signal generator, having a start input coupled to the output of said first comparator, having a stop input coupled to the output of said second comparator, and having an output coupled to said translating means.

7. A discriminator as claimed in claim 6, wherein said means for measuring further comprises;
a second counter, having a clock input coupled to said clock signal generator, having a start input coupled to the output of said second comparator, having a stop input coupled to the output of said first comparator, and having an output coupled to said translating means.

8. A discriminator for demodulating a periodic frequency modulated signal comprising:
means for identifying first and second points in the period of said signal, said identifying means comprising a limiter for converting said signal into a substantially bipolar signal having rising and falling edges which convey modulating information;
a clock generator for supplying a clock signal having a frequency greater than said carrier frequency; and
a counter having a clock input coupled to said clock generator, having an enabling input coupled to said limiter, having an output for supplying a duration value corresponding to the number of cycles of said clock signal occurring between said first and second points in time, and have a preset input;
means, coupled to said limiter and to said counter preset input, for presetting said counter to a predetermined count; and
means, coupled to said counting means, for translating said duration value into an amplitude value descriptive of aid modulating information, said translating means comprising a memory circuit configured to perform a table look-up operation using said duration value as a table index.

9. A discriminator for demodulating a frequency modulated signal, comprising:
a terminal adapted to receive said frequency modulated signal;
a clock generator for supplying a clock signal at a frequency greater than the carrier frequency of said signal;
a first comparator having an input coupled to said terminal, having a reference input receiving a first threshold voltage, and having an output for indicating that the voltage of said terminal exceeds said first threshold voltage;
a second comparator having an input coupled to said terminal, having a reference input receiving a second threshold voltage, and having an output for indicating that the voltage at said terminal is less than said second threshold voltage;
a first counter having a clock input coupled to said clock generator, having a start input coupled to the output of said first comparator, having a stop input coupled to the output of said second comparator, and having an output for supplying a duration value; and
a translation circuit having an input coupled to said first counter output, said translation circuit providing an output signal responsive to said duration value and descriptive of modulating information.

10. A discriminator as claimed in claim 9 wherein the outputs of said first and second comparators limit the amplitude of said modulated signal to a substantially constant amplitude.

11. A discriminator as claimed in claim 9 additionally comprising means, coupled to the output of said second comparator and to said first counter, for presetting said first counter to a predetermined count.

12. A discriminator as claimed in claim 9, wherein said translating circuit comprises:
a memory circuit configured so that said output signal results from a table look-up operation performed on said duration value.

13. A discriminator as claimed in claim 9 wherein said translation circuit comprises a comparison circuit having a first comparison input coupled to said first counter output, said comparison circuit being adapted to receive a predetermined data value so that said output signal results from a comparison operation between said duration value and said predetermined data value.

14. A discriminator as claimed in claim 9 additionally comprising a digital-to-analog conversion circuit having an input coupled to said translation circuit, said digital-to-analog conversion circuit providing an analog output signal descriptive of said modulating information.

15. A discriminator as claimed in claim 9, further comprising:
a second counter having a clock input coupled to said clock generator, having a start input coupled to the output of said second comparator, having a stop input coupled to the output of said first comparator, and having an output for supplying a duration value;
wherein said output of said second counter is also coupled to an input of said translation circuit.

16. A discriminator as claimed in claim 15, wherein said first and second counters each comprise:

a start circuit having an input connected to said start input, and having a start output;

a stop circuit having an input connected to said stop input, and having a stop output;

a first counting circuit having an enable input coupled to said start output;

a second counting circuit having an enable input coupled to said stop output, for counting responsive to said second comparator indicating that the voltage at said terminal is less than said second threshold voltage; and a decoder, having an input connected to the output of said second counting circuit, and having an output connected to a reset input of said first counting circuit, for resetting said first counting circuit responsive to the output of said second counting circuit reaching a predetermined value.

17. A method of demodulating a frequency modulated carrier signal, said method comprising the steps of:

identifying a first time at which the amplitude of said modulated signal exceeds a first threshold value, and a second time at which the amplitude of said modulated signal is below a second threshold value, said second threshold value being less than said first threshold value;

measuring the duration between said first and second times; and translating said duration from said measuring step into an amplitude value descriptive of modulating information.

18. A method as claimed in claim 17 wherein:

said modulated signal comprises a plurality of cycles; and said first threshold value corresponds to a positive amplitude and said second threshold value corresponds to a negative amplitude.

19. A method as claimed in claim 18 wherein said measuring step comprises the steps of:

generating a clock signal having a frequency greater than the frequency of said carrier signal;

counting, from a predetermined count value at said first time, the number of cycles of said clock signal;

halting said counting at said second time; and reading the count obtained by said counting step; said count corresponding to said duration.

20. A method as claimed in claim 17, wherein said translating step comprises:

associating, in a data table stored in a memory, one of a finite integral number of amplitude data values for each one of said durations so that a table look-up operation in said data table produces said amplitude value descriptive of said modulating information.

21. A method as claimed in claim 17 wherein said identifying step includes limiting said frequency modulated carrier signal to a substantially constant amplitude.

22. A method as claimed in claim 17 wherein:

said measuring step produces a duration value; and said translating step compares said duration value to a predetermined data value to produce said amplitude value descriptive of said modulating information.

23. A method as claimed in claim 17, wherein:

said amplitude value resulting from said translating step is in the form of a digital signal; and said method additionally comprises the step of converting said digital signal into an analog signal.

24. A method as claimed in claim 17, wherein said measuring step comprises:

generating periodic signals at a rate in excess of the frequency of said carrier signal;

measuring the number of said periodic signals between said first time and said second time to establish the duration of a first half-wave between said first time and said second time; and measuring the number of said periodic signals between said second time and the next following first time to establish the duration of a second half-wave between said second time and said next following first time.

* * * * *